Figure 1:
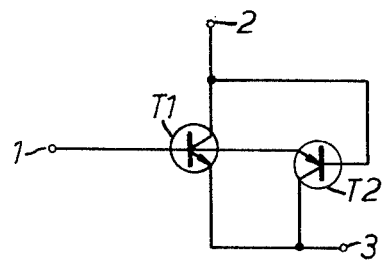

United States Patent [19]

Ring

[11] 4,027,180

[45] May 31, 1977

[54] INTEGRATED CIRCUIT TRANSISTOR ARRANGEMENT HAVING A LOW CHARGE STORAGE PERIOD

[75] Inventor: Arthur Edward Ring, Biggleswade, England

[73] Assignee: Plessey Handel und Investments A.G., Switzerland

[22] Filed: Dec. 31, 1975

[21] Appl. No.: 645,705

[30] Foreign Application Priority Data

Jan. 10, 1975 United Kingdom ............ 01046/75

[52] U.S. Cl. .............................. 307/303; 307/313; 357/42; 307/300
[51] Int. Cl.[2] ............................................. H01L 27/06
[58] Field of Search ............ 357/42; 307/313, 303, 307/300

[56] References Cited

UNITED STATES PATENTS

| 2,891,173 | 6/1959 | Helbig | 307/313 X |
| 3,233,125 | 2/1966 | Buie | 307/313 X |
| 3,725,754 | 4/1973 | Furuhashi | 307/303 X |
| 3,825,774 | 7/1974 | Van Kessel et al. | 307/313 X |

*Primary Examiner*—John S. Heyman
*Attorney, Agent, or Firm*—Fleit & Jacobson

[57] ABSTRACT

A transistor arrangement having a relatively low charge storage period including an N.P.N. transistor having the base thereof connected to the emitter of a P.N.P. transistor and to an input terminal, the collector thereof connected to the base of the P.N.P. transistor and to an electrical supply terminal, and the emitter thereof connected to the collector of the P.N.P. transistor and to another electrical supply terminal.

5 Claims, 3 Drawing Figures

4,027,180

INTEGRATED CIRCUIT TRANSISTOR ARRANGEMENT HAVING A LOW CHARGE STORAGE PERIOD

The invention relates to a transistor arrangement having a relatively low charge storage period.

In the use of saturated mode switching circuits a switching delay known as 'storage time delay' is commonly experienced when the base/collector junction of a transistor is forced to conduct by the application of excessive base current. It is known to reduce the storage time delay by either gold doping, Schottky diode clamping or the connection of an extra emitter to the base of the transistor. Gold doping is associated with integrated circuit arrangements and has the disadvantage that it also inhibits all P.N.P. action and thereby prevents the use of P.N.P transistors in the switching circuits. Schottky diode clamping has the disadvantage that it gives a large increase in the $V_{CE\ SAT}$ of the transistor to which it is applied and the connection of a feedback emitter has the disadvantages that it requires a process having a high inverse $\beta$ which is not always possible to obtain and that it consumes extra active semiconductor area.

The invention provides a transistor arrangement having a relatively low charge storage period including an N.P.N transistor having the base thereof connected to the emitter of a P.N.P transistor and to an input terminal, the collector thereof connected to the base of the P.N.P. transistor and to an electrical supply terminal, and the emitter thereof connected to the collector of the P.N.P. transistor and to another electrical supply terminal. In a preferred arrangement, the N.P.N. and P.N.P. transistors are in the form of an integrated circuit.

Figure 2:
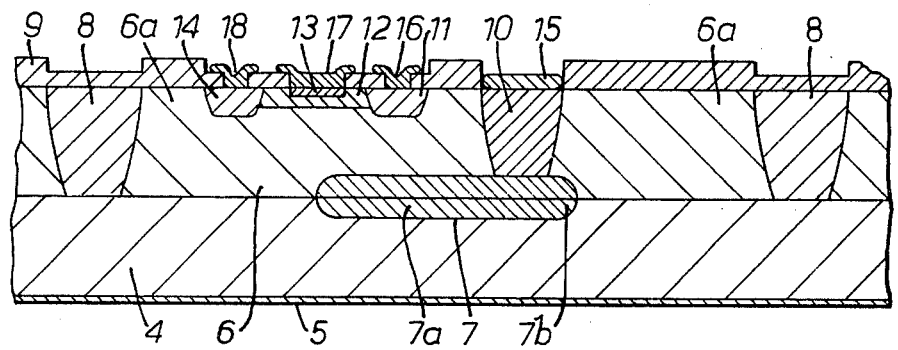
Figure 3:
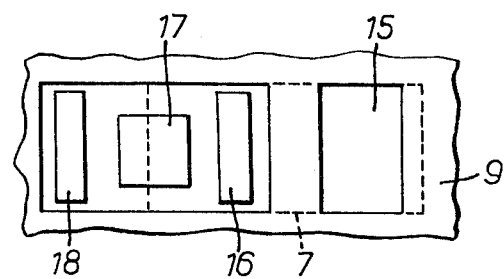

The foregoing and other features according to the invention will be better understood from the following description with reference to the accompanying drawings, in which:

FIG. 1 illustrates the circuit diagram of a transistor arrangement according to the invention, and FIGS. 2 and 3 diagrammatically illustrate respectively in a plan view and a cross-sectional side elevation a preferred structural arrangement for the transistor arrangement of FIG. 1.

Referring to FIG. 1 of the drawings, the circuit diagram of a transistor arrangement according to the invention is illustrated therein and includes an N.P.N. transistor T1 and a P.N.P. transistor T2. The base of the transistor T1 is connected to the emitter of the transistor T2 and to an input terminal 1. The collector of the transistor T1 is connected to the base of the transistor T2 and to an electrical supply terminal 2. The emitter of the transistor T1 is connected to the collector of the transistor T2 and to an electrical supply terminal 3.

The transistor T2 is used to divert the excess base current of the transistor T1 and to thereby effect a reduction in the storage time delay of the transistor T1.

FIGS. 2 and 3 diagrammatically illustrate respectively in a plan view and a cross-sectional side elevation a preferred structural arrangement for the transistor arrangement of FIG. 1 wherein a substrate P.N.P. transistor is fabricated as an integral part of the N.P.N. transistor to divert excess base current to the integrated circuit substrate 4 which is of P-type conductivity and which constitutes the collector of the P.N.P. transistor T2 of FIG. 1.

A layer 5 of an electrically conductive material is formed in any known manner on one of the major surfaces of the substrate 4 and a layer 6 of a semiconductive material of N-type conductivity is epitaxially grown in a known manner on the other major surface of the substrate 4. The layer 5 constitutes the collector contact of the transistor T2.

A semiconductive region 7 of N+ type conductivity is provided at the interface of the substrate 4 and the layer 6. A part 7a of the region 7 is formed by selectively diffusing the surface of the substrate 4 prior to the formation of the layer 6 with a suitable dopant, the part 7b being formed during the epitaxial growth of the layer 6.

The layer 6 is divided into sections, such as the section 6a by diffused regions 8 which are of P+ type conductivity, each section of the layer 6 being used for the fabrication of the transistor arrangement of FIG. 1.

A protective oxide layer 9 is formed on the surface of the layer 6 and this oxide layer is used in a known manner to facilitate the formation of diffused regions 10 to 14 in the layer 6.

The diffused region 10 which is of N+ type conductivity, extends from the surface of the layer 6 to the region 7. An electrical contact 15 is formed in a known manner on the surface of the region 10 to provide the collector contact for the N.P.N. transistor T1 of FIG. 1 and the base contact for the P.N.P. transistor T2.

The diffused regions 11 and 14 are of P+ type conductivity and have electrical contacts 16 and 18 respectively formed on the surfaces thereof in a known manner. The contact 16 is the base contact for the N.P.N. transistor T1 and the contact 18 is the base contact for the N.P.N. transistor T1 and the emitter contact for the P.N.P. transistor T2.

The diffused regions 12 and 13 are respectively of P type and N+ type conductivity and an electrical contact 17 for the emitter of the N.P.N. transistor T1 is formed in a known manner on the surface of the region 13.

With the integrated circuit arrangement of FIGS. 2 and 3, the minority carrier charge held in the base region of the P.N.P. transistor is substituted for the minority carrier charge which would normally be held in the collector of the N.P.N. transistor in saturation. For a buried collector, high resistivity epitaxy, integrated circuit process with a lightly doped expitaxial region, this change of location of charge gives a marked reduction in the magnitude of charge because the base transit time of the P.N.P. transistor is much lower than the transit time from the base/collector junction to the buried N+ region 7. The reason for this is that there is an inherent retarding field acting on minority carriers crossing the epitaxial region towards the buried N+ region 7 whereat rapid recombination takes place, whereas there is no inbuilt field acting on minority carriers crossing directly from the layer 6 to the substrate 4 where collection takes place. The reduction of stored charge gives a proportionate reduction in storage time delay.

The transistor arrangement of FIGS. 1 to 3 has a particular but not necessarily an exclusive application in the saturating logic for a programmable logic array. The transistor arrangement could in fact be used to advantage in any form of saturating logic.

It can therefore be seen from the foregoing that the main advantages of the transistor arrangement according to the invention are that (a) the excess base current of an N.P.N. transistor is diverted to the substrate of the integrated circuit in order to effect a reduction in the storage time delay and (b) the N.P.N. and P.N.P. transistors can be combined into a composite structure no larger than an N.P.N. transistor in standard integrated circuit form thereby avoiding mismatch between the base/emitter forward voltage of the P.N.P. transistor, and the base/collector forward voltage of the N.P.N. transistor caused by differing junction characteristics and collector bulk resistance.

It is to be understood that the foregoing description of specific examples of this invention is made by way of example only and is not to be considered as a limitation in its scope.

I claim:

1. A transistor arrangement having a relatively low charge storage period comprising, a semiconductor substrate of P type conductivity having an electrically conductive layer formed on one of the major surfaces thereof and a semiconductive layer of N type conductivity formed on the other major surface thereof; a first N+ type region situated at the interface of the substrate and the N type layer; a second N+ type region formed in the surface of the N type layer and extending to the first region; a P type region formed in the surface of the N type layer, the first region being partially overlapped by the P type region; two spaced-apart P+ type regions formed in the surface of the N type layer, each of the P+ type regions being contiguous with and situated at opposite sides of, the P type region; a third N+ type region formed in the surface of the P type region; electrical contacts for the second, third, and each of the P+ type regions; and a protective oxide layer formed on the exposed regions of the surface of the N type layer.

2. A transistor arrangement as claimed in claim 1 wherein the semiconductor substrate is common to a plurality of said transistor arrangements and wherein the N type layer is divided into a number of sections by P+ type regions which extend from the surface of the N type layer to the interface of the N type layer with the substrate, each of the divided sections comprising a separate transistor arrangement.

3. A transistor arrangement having a relatively low charge storage period including an N.P.N. transistor having the base thereof connected to the emitter of a P.N.P. transistor and to an input terminal, the collector thereof connected to the base of the P.N.P. transistor and to an electrical supply terminal, and the emitter thereof connected to the collector of the P.N.P. transistor and to another electrical supply terminal, the transistor arrangement in the form of an integrated circuit which includes a semiconductor substrate of P type conductivity having an electrically conductive layer formed on one of the major surfaces thereof and a semiconductive layer of N type conductivity formed on the other major surface thereof; a first N+ type region situated at the interface of the substrate and the N type layer; a second N+ type region formed in the surface of the N type layer and extending to the first region; a P type region formed in the surface of the N type layer, the first region being partially overlapped by the P type region; two spaced-apart P+ type regions formed in the surface of the N type layer, each of the P+ type regions being contiguous with and situated at opposite sides of, the P type region; a third N+ type region formed in the surface of the P type region; electrical contacts for the second, third, and each of the P+ type regions; and a protective oxide layer formed on the exposed regions of the surface of the N type layer.

4. A transistor arrangement capable of use in a saturated mode logic array having a relatively low charge storage period including an N.P.N. transistor having the base thereof connected to the emitter of a P.N.P. transistor and to an input terminal, the collector thereof connected to the base of the P.N.P. transistor and to an electrical supply terminal, and the emitter thereof connected to the collector of the P.N.P. transistor and to another electrical supply terminal, the transistor arrangement in the form of an integrated circuit which includes a semiconductor substrate of P type conductivity having an electrically conductive layer formed on one of the major surfaces thereof and a semiconductive layer of N type conductivity formed on the other major surface thereof; a first N+ type region situated at the interface of the substrate and the N type layer; a second N+ type region formed in the surface of the N type layer and extending to the first region; a P type region formed in the surface of the N type layer, the first region being partially overlapped by the P type region; two spaced-apart P+ regions formed in the surface of the N type layer, each of the P+ type regions being contiguous with and situated at opposite sides of, the P type region; a third N+ type region formed in the surface of the P type region; electrical contacts for the second, third, and each of the P+ type regions; and a protective oxide layer formed on the exposed regions of the surface of the N type layer.

5. A transistor arrangement capable of use in a saturated mode logic array in a programmable logic array having a relatively low charge storage period including an N.P.N. transistor having the base thereof connected to the emitter of a P.N.P. transistor and to an input terminal, the collector thereof connected to the base of the P.N.P. transistor and to an electrical supply terminal, and the emitter thereof connected to the collector of the P.N.P. transistor and to another electrical supply terminal, the transistor arrangement in the form of an integrated circuit which includes a semiconductor substrate of P type conductivity having an electrically conductive layer formed on one of the major surfaces thereof and a semiconductive layer of N type conductivity formed on the other major surface thereof; a first N+ type region situated at the interface of the substrate and the N type layer; a second N+ type region formed in the surface of the N type layer and extending to the first region; a P type region formed in the surface of the N type layer, the first region being partially overlapped by the P type region; two spaced-apart P+ type regions formed in the surface of the N type layer, each of the P+ type regions being contiguous with and situated at opposite sides of, the P type region; a third N+ type region formed in the surface of the P type region; electrical contacts for the second, third, and each of the P+ type regions; and a protective oxide layer formed on the exposed regions of the surface of the N type layer.

* * * * *